United States Patent [19]

Tiemann et al.

[11] Patent Number: 4,903,026

[45] Date of Patent: Feb. 20, 1990

[54] ARCHITECTURE FOR HIGH SAMPLING RATE, HIGH RESOLUTION ANALOG-TO-DIGITAL CONVERTER SYSTEM

[75] Inventors: Jerome J. Tiemann, Schenectady; William E. Engeler, Scotia; Kenneth B. Welles, Schenectady, all of N.Y.

[73] Assignee: General Electric Company, Schenectady, N.Y.

[21] Appl. No.: 274,082

[22] Filed: Nov. 22, 1988

[51] Int. Cl.$^4$ .......................... H03M 1/20; H03M 1/38
[52] U.S. Cl. .................................... 341/131; 341/161; 341/155
[58] Field of Search ............... 341/126, 118, 155, 159, 341/131, 161

[56] References Cited

U.S. PATENT DOCUMENTS

| | | |
|---|---|---|
| 3,790,947 | 2/1974 | Campbell et al. .................... 341/131 |
| 4,308,524 | 12/1981 | Harrison et al. ................ 341/118 X |
| 4,768,016 | 8/1988 | Chu et al. ............................ 341/159 |

Primary Examiner—William M. Shoop, Jr.
Assistant Examiner—Sharon D. Logan

Attorney, Agent, or Firm—Marvin Snyder; James C. Davis, Jr.

[57] ABSTRACT

A high resolution analog-to-digital (A/D) converter (14) and a pipelined A/D converter are used in a single system so that unknown offset and gain errors of the pipe-lined A/D converter are determined and corrected. Each stage of the pipelined A/D converter includes a flash A/D converter (16), a corresponding digital-to-analog (D/A) converter (18), and a differential amplifier (20) so that, in each stage the output voltage of the D/A converter is subtracted from a sample of the analog input voltage, to constitute the input signal for the next stage. The flash A/D converter of each stage addresses digital words in memory (22) which, when summed by an adder chain (24), constitute the output signal of the system. The flash A/D converter output signals are also supplied to corresponding stages of a shift register (28 or 28') which accumulates the memory address bits. A comparator and finite state machine (26) receives the memory address bits from the shift register and iteratively compares the digital output signals of the pipelined A/D converter and the high resolution A/D converter and corrects the words in memory addressed by the flash A/D converters to improve resolution of the system.

16 Claims, 4 Drawing Sheets

STATE TABLE

| NAME OF STATE | STATE DESCRIPTION | ADDITIONAL COMMENTS | STATEMENT OF CONDITIONS FOR TRANSITION TO THE INDICATED ENGINEERING STATE: CLOCK PULSES | | | | | |
|---|---|---|---|---|---|---|---|---|
| | | | 1 | 2 | 3 | 4 | 5 | 6 |
| IDLE | 1 | i | | A | | | | |
| START CALIBRATION | 2 | ii | R | | B | | | |
| WAIT FOR PIPELINE | 3 | iii | R | | | C | | |
| WAIT FOR SLOW A/D | 4 | iv | R | | | | D | |
| COMPUTE UPDATE | 5 | v | R | | | | | E |
| UPDATE COEFFS | 6 | vi | F | | | | | |

FIG. 4

ARCHITECTURE FOR HIGH SAMPLING RATE, HIGH RESOLUTION ANALOG-TO-DIGITAL CONVERTER SYSTEM

CROSS-REFERENCE TO RELATED APPLICATION

This application is related in subject matter to Chu et al. U.S. Pat. No. 4,768,016, "Timing and Control Circuitry for Flash Analog to Digital Converters with Dynamic Encoders", issued Aug. 30, 1988 and assigned to the instant assignee, and is incorporated herein by reference.

BACKGROUND OF THE INVENTION

1. Field of the Invention

The present invention generally relates to analog-to-digital (A/D) converters and, more particularly, to an architecture for an A/D converter system which combines high resolution with a high sampling rate.

2. Description of the Prior Art

In many applications, a signal to be sampled and converted to a digital number is extremely small compared to added noise or interference, and if the signal were to be digitized by a low resolution A/D converter, all trace of it would be lost. Thus, even though it may have been possible to extract the signal out of the noise by filtering or other signal processing, the signal would be irretrievably lost due to quantization. In these instances, there are only two alternatives; either the signal processing must be performed in the analog domain, or the resolution of the A/D conversion must be increased. In some instances, it is not practical to perform the signal processing in the analog domain, and the only alternative is to increase the resolution of the A/D conversion. This, however, may be unacceptable where real time operation is required.

A/D converters may be divided into two generic categories - high speed, low resolution A/D converters, such as the so-called flash A/D converter, and low speed, high resolution A/D converters, such as Sigma-Delta and dual slope A/D converters. It would be desirable if the advantages of both categories of A/D converters could be combined into a single A/D converter which could thereby provide both high sampling rates and high resolution.

One obstacle to simply combining the two types of converters is that fast, high resolution A/D converters would require either a pipelined architecture or an impractically large number of comparators. The pipelined architecture requires thresholds that have an absolute precision at the level of the least significant bit, and it is impractical to implement these thresholds with present day comparator circuits. Practical comparators have uncertain thresholds due to subtle process variations and environmental parameters such as temperature.

The low speed A/D converter circuits mentioned above do not have the aforementioned drawbacks associated with pipelined architecture. This is because they are inherently incremental in operation, which is also the reason for their slow speed of operation.

SUMMARY OF THE INVENTION

It is therefore an object of the present invention to provide an A/D converter architecture which achieves both a high sampling rate and high resolution.

It is another object of the invention to provide a generic architecture for implementing high resolution A/D converters that operate at high sampling rates.

It is a further object of the invention to provide an A/D converter system with a self-calibration capability which is effective even during noisy signal input.

It is yet another object of the invention to provide an A/D converter system which is capable of self-calibration but allows for selective calibration under external control.

According to the invention both types of A/D converters, low speed high resolution and high speed low resolution, are used in the same system, so that the unknown offset and gain errors encountered in the pipelined architecture can be determined and corrected. This is achieved by having both types of A/D converters operate on some of the samples, at intervals determined by the speed of the slow A/D converter, and by comparing the digital output signals of the two types of A/D converters. If the samples are judiciously chosen, the uncertain parameters which affect the monotonicity of the fast A/D converter can be deduced from them, and the resolution of the fast A/D converter can be improved.

In the preferred embodiment, a pipelined architecture is provided for a high speed A/D converter system in which each stage includes a sample and hold circuit for sampling an analog signal, a multi-bit or single bit flash A/D converter for converting the sampled and held analog voltage to digital form, a corresponding digital-to-analog (D/A) converter for reconverting the digital signal back to analog, and a differential amplifier. The differential amplifier subtracts the output voltage of the D/A converter from the sampled and held input voltage to produce a residual analog voltage which is then converted to digital and back to analog form by the subsequent stage. The output bits of the flash A/D converters of each stage address digital words in a random access memory which, when summed, constitute the output data of the high speed A/D converter system. The output bits of the flash A/D converters are also provided to corresponding stages of a shift register which accumulates the memory address bits. A comparator and processor, which may be a finite state machine, receives as an input signal the memory address bits accumulated by the shift register and performs an iterative comparison of the digital output data of the pipelined A/D converter and of a high resolution A/D converter sampling the analog signal, and corrects the words in memory addressed by the flash A/D converters.

BRIEF DESCRIPTION OF THE DRAWINGS

The foregoing and other objects, aspects and advantages of the invention will be better understood from the following detailed description of a preferred embodiment of the invention with to the drawings, in which:

FIG. 4 is a state table showing the states of the comparator finite state machine used in the system shown in FIG. 3.

DETAILED DESCRIPTION OF THE PREFERRED EMBODIMENT OF THE INVENTION

Figure 1:
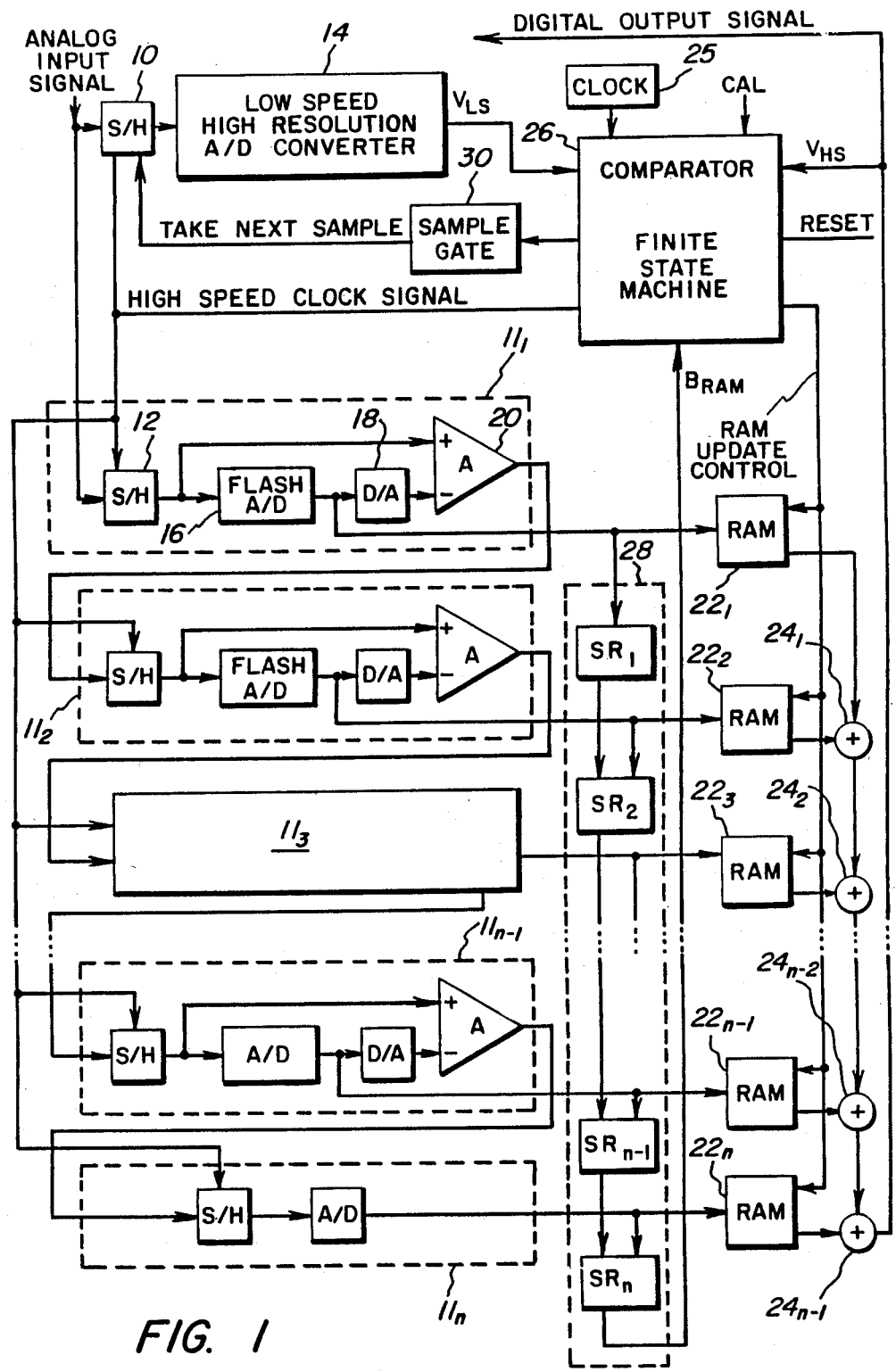
FIG. 1 is a block diagram showing the overall architecture according to one implementation of the invention.

As shown in FIG. 1, a high bandwidth analog input signal is supplied to two sample-and-hold (S/H) circuits 10 and 12 in parallel. S/H circuit 12 operates once during every clock cycle, and supplies an output signal to a high speed A/D converter system comprised of a pipeline of n stages and other components. S/H circuit 10 operates only during a small fraction of each clock period so that A/D converter 14 has sufficient time to operate and produce a high resolution digital value corresponding to the held sample of the analog input signal. A suitable A/D converter 14 may be, for example, a dual slope integrating A/D converter such as an Analog Devices model AD1175K, which provides twenty-two bits of resolution and up to one ppm (parts per million) accuracy at twenty conversions per second.

Each of stages $11_1$-$11_{n-1}$ of the pipeline in the high speed A/D converter system is comprised of a S/H circuit 12, a flash A/D converter 16 of modest resolution coupled to the output of S/H circuit 12, a corresponding D/A converter 18 coupled to the output of flash A/D converter 16, and a differential amplifier 20 having one input coupled to the output of D/A converter 18 and the other input coupled to the output of S/H circuit 12. The input signal to S/H circuit 12 of stage $11_1$ is the analog input signal to the high resolution A/D converter, while the input signal to the S/H circuit of each of the subsequent stages is received from the output of amplifier 20 in the immediately preceding stage. Amplifier 20 has a gain slightly less than the power of two corresponding to the number of bits of resolution of the flash A/D subconverter. Thus, if flash A/D converter 16 is a three-bit (eight-level) converter, the gain of differential amplifier 20 might be chosen to be about 7.0. In this way, the "error" voltage (i.e., the difference between the input signal and the partially quantized result) will be at an amplitude that utilizes almost all (but not more than all) of the levels of the flash A/D converter in the next stage. This "error" or difference voltage is then sampled and held for the next stage, and the process repeats for as many stages as there are in the fast A/D converter system. The final stage $11_n$ omits D/A converter 18 and amplifier 20. While practice of the invention is not limited to any particular type of flash A/D converter, an example of a suitable flash A/D converter which may be used is disclosed in the cross-referenced Chu et al. Pat. No. 4,768,016.

At this juncture, the analog input voltage can be considered to be a sum of all the voltage portions that have been deleted by differential amplifiers 18, plus a final remainder at the end. These voltage portions correspond to whatever signal the D/A converters have generated and are scaled according to whatever gains the differential amplifiers produce, but if the digital equivalents of these scaled values were known, the correct digital equivalents of the original analog voltage could be determined by simply adding up these digital equivalents of the scaled values. Thus the problem of producing a digital output signal that is correct to a large number of bits (i.e., a high resolution signal) is equivalent to the problem of measuring, to that same number of bits of resolution, the scaled values that correspond to all the D/A converter output signals.

The high speed A/D converter system implements the process described above. The bits from each flash A/D converter 16 access a word stored in random access memories (RAMs) $22_1$-$22_n$ associated with each of the respective pipeline stages $11_1$-$11_n$. The word retrieved from RAM $22_1$ is then added by adders $24_1$-$24_{n-1}$ with all of the corresponding words from RAMs $22_2$-$22_n$ to produce the digital output words of the high speed A/D converter system. What is needed is to cause these words to correspond to the scaled voltage portions that the D/A converters generate. This is done by an iterative process in which each respective digital output word from the high speed A/D converter system is compared to the corresponding respective output word of the low speed A/D converter, and the words in the RAM memory locations that have contributed to the sum are incremented or decremented according to whether the comparison of the output words is too small or too large, assuming the slow speed converter output words are correct.

The output words of low speed A/D converter 14 are supplied to one input of comparator and processor (or finite state machine) 26, while the high speed digital output words from the adder chain $24_1$-$24_{n-1}$ are supplied to another input thereof. Comparator and finite state machine 26, which is operated at a speed determined by the system clock 25, controls, through a sample gate 30, S/H circuit 10 so as to initiate taking the next sample of the analog input signal. A third input signal to comparator and processor 26 is supplied by the output of an n-stage shift register 28. Comparator and processor 26 may be implemented with discrete comparator circuits and a general purpose microprocessor of conventional design. However, in the preferred embodiment of the invention, a single custom VLSI (very large scale integrated) circuit comparator and finite state machine would be used in order to minimize the chip count.

Each stage $SR_1$-$SR_n$ of shift register 28 is connected to the output of the corresponding flash A/D converter 16 in the high speed, pipelined A/D converter. Thus the output signal of shift register 28 supplied to comparator and finite state machine 26 constitutes the memory address bits. These memory address bits are used to update the bits in memory $22_1$-$22_n$ as required.

Figure 2:
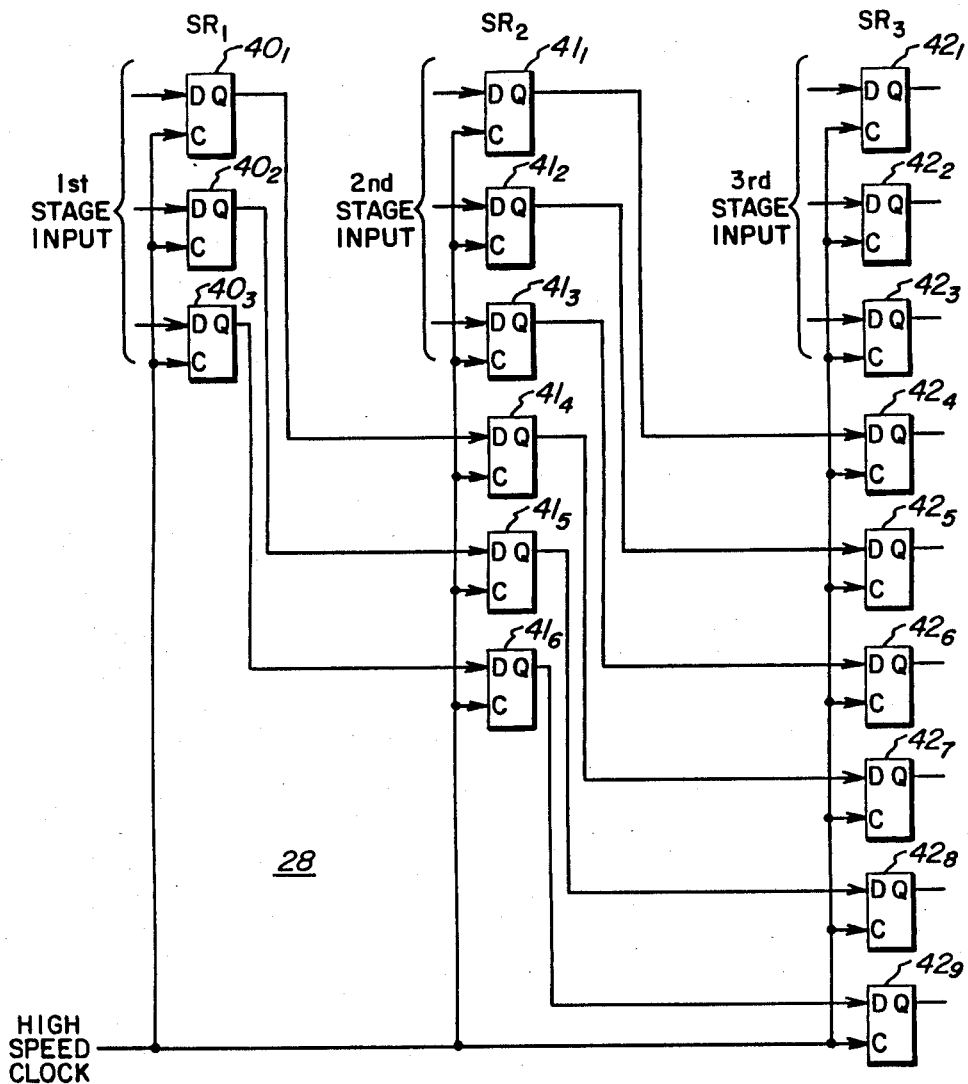
FIG. 2 is a block diagram showing in more detail the shift register structure of the system shown in FIG. 1.

FIG. 2 shows, in more detail, a portion of the structure of shift register 28 of FIG. 1 in the case where three bits per pipeline stage are used. The first stage $SR_1$ comprises three flip-flops $40_1$, $40_2$ and $40_3$ which receive in parallel, on each clock cycle, the three bits from flash A/D converter 16 in stage $11_1$ of the pipelined fast A/D converter, shown in FIG. 1. These flip-flops may be, for example, 74LS74 type CD flip-flop shift registers. The second stage $SR_2$ comprises six flip-flops $41_1$ to $41_6$. The first three of these flip-flops receive in parallel, on the same clock cycle, the three bits from flash A/D converter 16 in stage $11_2$ of the pipelined fast A/D converter. The second three flip-flops $41_4$, $41_5$ and $41_6$ receive in parallel, on the same clock cycle, the output signals of flip-flops $40_1$, $40_2$ and $40_3$, respectively, representing data generated during the immediately preceding clock cycle. The third stage $SR_3$ of the shift register comprises nine flip-flops $42_1$ to $42_9$, and so forth. Thus, for the example illustrated, each succeeding shift register stage adds three lines to the data path so that all data from any one conversion arrive at the finite state machine, shown in FIG. 1, simultaneously. For a multi-bit shift register capable of resolving n bits per stage, each shift register stage can accumulate MN bits, M being the relative position of that shift register stage in shift register 28.

With reference to FIG. 1, the finite state machine causes a pipelined, high speed A/D conversion to commence while at the same time causing S/H circuit 10 to sample the analog input signal being converted by the pipelined A/D converter and to hold this sample for a long enough time to allow low speed A/D converter 14 to convert it accurately to a digital value $V_{LS}$. The high speed digital value $V_{HS}$ for this particular analog sample is acquired by the finite state machine. Finally, the RAM address bits $B_{RAM}$ from shift register 28 which correspond to this particular analog sample are also taken by the finite state machine.

The digital signals $V_{LS}$, $V_{HS}$ and $B_{RAM}$ are processed by the finite state machine. $V_{LS}$-$V_{HS}$ is the error. The $B_{RAM}$ word contains N bits of address data for each of n pipeline stages. A value proportional to the error $V_{LS}$-$V_{HS}$ is added to the RAM location of each of the n stages as defined by the N bits corresponding to the respective stage.

An additional input signal CAL to comparator and finite state machine 26 inhibits initiation of a calibration cycle when in one state (i.e., logical zero) and allows the calibration cycle to commence when it is raised to logical one. This permits several different modes of operation. With the CAL signal continuously high, the high speed A/D converter system calibrates itself on whichever samples happen to be available when the previous conversion is finished. This operation is especially suitable in situations where the input signal is dominated by noise or where it is particularly broadband in nature. In situations where the input signal is periodic, however, it is not always true that a periodic subset of samples has the same distribution as the parent set. The slow A/D converter 14 may always take its samples at a particular point in the periodic waveform, and some of the words in memory $22_1$-$22_n$ may never be corrected. To cope with this situation, either of two approaches can be implemented in the system. First, the CAL signal can be activated periodically with a period just slightly different from the period of the input signal. Second, a portion of the period can be devoted to calibration, and a calibration signal (such as a ramp) can be employed during that portion of each period. When the first approach is used, the sampling times of the selected samples will slowly precess through the entire input signal waveform (in much the same way as occurs in a sampling oscilloscope) and all parts of the waveform will be represented. In the second approach, which applies to television and active scanning systems such as RADARs, there is an interval in each time period when the input signal is not of interest. In the case of television, this interval corresponds to the retrace interval while, in the active scan case, it is the interval during which the scanning pulse is being transmitted.

Figure 3:
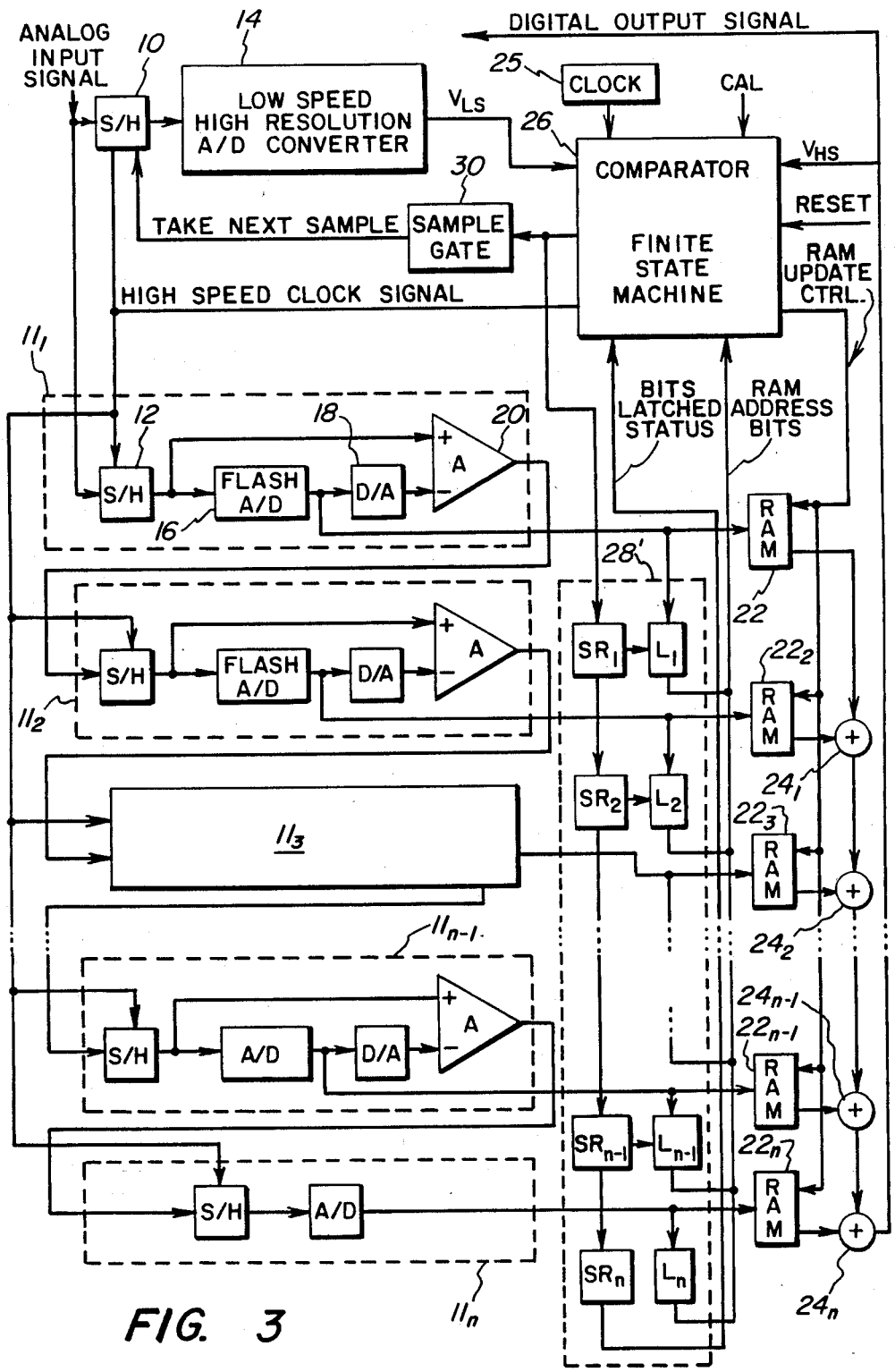
FIG. 3 is a block diagram showing a modification of the invention using a single bit shift register.

FIG. 3 shows a modification of the implementation of the invention shown in FIG. 1. More specifically, the FIG. 1 implementation utilizes a multi-bit shift register 28 to collect the raw bits and deliver them to comparator and finite state machine 26. The implementation in FIG. 3 employs a single bit shift register 28' in which a single binary "one" is inserted at the time the slow A/D converter 14 is activated. This single "one" is propagated in parallel with the chosen analog sample as it propagates through the pipeline and it signals that the raw bit from the comparator at that stage is to be latched into a respective single bit latch $L_1$-$L_n$ coupled to respective shift register stages $SR_1$-$SR_n$. When the single binary "one" emerges from the last shift register stage $SR_n$, all of the raw bits have been latched, and the computation of the error by comparator and finite state machine 26 is allowed to commence.

FIG. 4 illustrates the state table for finite state machine 26, shown in FIG. 3. The third column of the state table includes lower case Roman numerals i to vi of additional comments, and the fourth column of the table includes letters corresponding to a statement of conditions for transition to the indicated state. The additional comments and conditions for transition are set out in detail below.

STATE TABLE ADDITIONAL COMMENTS (i) In the idle state, the high speed pipelined A/D converter system is delivering output data at full speed using whatever coefficients are in its register at the time. All other components are ready to do a calibrate/update cycle, but are awaiting a signal to begin.

(ii) The calibrate control line having been activated with a logical one CAL signal, S/H circuit 10 is commanded into its hold state, low speed A/D converter 14 is commanded to start a conversion, and a binary one acting as an acquisition "pilot" bit is inserted into shift register 28 at stage $SR_1$ from comparator and finite state machine 26 when sample gate 30 receives an input pulse, so that the raw bit of each pipeline stage is captured in a latch associated with the respective shift register stage as the chosen sample propagates through the pipeline. Additionally, an acknowledgement that the process has started can be supplied by actuating a host system with the "pilot" bit, if desired.

(iii) The "Wait for Pipeline" state needs no output signals. When the "pilot" bit emerges from stage $SR_n$ of shift register 28, the output of the high speed pipeline A/D converter system is read from the final stage of adder chain $24_1$-$24_{n-1}$ and the raw bits are read from the latches of the shift register. Alternatively, the finite state machine in the system of FIG. 1 may contain an auxiliary counter (not shown) which can hold a count at least as great as the number of stages in the pipeline. This auxiliary counter is set to a count equal to the number of stages present, simultaneously with activation of the calibration pulse (which chooses an analog sample for calibration) and the counter is decremented once for each subsequent clock pulse. When this auxiliary counter has counted down to zero, the raw bits corresponding to the chosen analog sample are emerging from the shift register.

(iv) "Wait for Slow A/D" requires no output signals. When the conversion complete status line from the slow A/D converter becomes active, its output signal is read by finite state machine 26, which then transitions to the next state.

(v) One simple way to compute the update is to subtract the difference between signals $V_{LS}$ and $V_{HS}$ supplied by comparator finite state machine 26 and divide this difference by n, the number of stages. The quotient is the update. Other, more complex, algorithms are also possible.

(vi) To update the coefficients, the raw bits are checked in comparator and finite state machine 26 to see which coefficients participated in the sum that comprises the output signal of the high speed A/D converter system. Those raw bits which participated are changed by adding the update to their previous (or current) value in RAMs $22_1$-$22_n$.

STATE TABLE CONDITIONS FOR TRANSITIONS (A) The transition from the "Idle" to "Start Calibration" state occurs in synchronism with the first clock pulse after the calibrate control line becomes active with a logical one CAL signal.

(B) The transition from "Start Calibration" to "Wait for Pipeline" starts as soon as the auxiliary counter in the finite state machine employed in the system of FIG. 1 does not indicate a count of zero.

(C) The transition from "Wait for Pipeline" to "Wait for Slow A/D" occurs when the auxiliary counter in the finite state machine employed in the system of FIG. 1 indicates a count of zero.

(D) The transition from "Wait for Slow A/D" to "Compute Update" occurs when the "Conversion Complete" status is received by finite state machine 26 from slow A/D converter 14.

(E) The transition from "Compute Update" to "Update Coeffs" is the termination of the algorithm for computing the updates. This can be indicated by an appropriate jump instruction in finite state machine 26 at the end of the computation.

(F) The transition from "Update Coeffs" to the "Idle" state is the completion of the process of updating the coefficients in the pipeline registers. Normally, this process, carried out by finite state machine 26, will comprise a sequence of "store" instructions, and the end of the process can be denoted by a jump instruction after the last store instruction.

(R) It may be desirable to further condition each of the above transitions with the state of a reset line for finite state machine 26 being inactive. Additionally, a transition to the idle state can be initiated when all other conditions are true, and the reset line is true as well.

While only certain preferred features of the invention have been illustrated and described herein, many modifications and changes will occur to those skilled in the art. It is therefore, to be understood that the appended claims are intended to cover all such modifications and changes as fall within the true spirit of the invention.

What we claim is:

1. A high sampling rate, high resolution analog-to-digital converter system comprising:
   a low speed, high resolution analog-to-digital converter for providing a first digital output signal in response to a system analog input signal;
   first sample and hold circuit means coupled to the input of said low speed analog-to-digital converter and operable at said low speed for sampling said system analog input signal;
   a high speed, low resolution pipelined analog-to-digital converter including second sample and hold circuit means operable at said high speed for sampling said system analog input signal, said high speed, low resolution analog-to-digital converter being adapted to generate address bits;
   memory means coupled to receive address bits from said high speed, low resolution analog-to-digital converter for generating a second digital output signal corresponding to said analog input signal and
   comparator means responsive to said first and second digital output signals for iteratively comparing said digital signals and being adapted to correct said second digital output signal by updating said memory means at said low speed rate said corrected second digital output signal thereby representing the high sampling rate, high resolution analog to digital converter system output signal.

2. The high sampling rate, high resolution analog-to-digital converter system of claim 1 wherein said pipelined analog-to-digital converter comprises n pipeline stages where n is a number greater than 1, each of said pipeline stages being capable of generating a respective portion of said address bits, said high sampling rate, high resolution analog-to-digital converter system further comprising shift register means having n stages, each of said pipeline stages being coupled, respectively, to a corresponding one of the shift register stages for accumulating and supplying said address bits to said comparator means for updating said memory means.

3. The high sampling rate, high resolution analog-to-digital converter system of claim 2 wherein said shift register means comprises a multi-bit shift register in which each shift register stage can accumulate MN address bits, N being the number of bits resolution of each pipeline stage and M being the relative position of said each shift register stage in said shift register.

4. The high sampling rate, high resolution analog-to-digital converter system of claim 2 wherein said shift register means comprises:
   a single bit shift register in which each shift register stage can accumulate a single bit, for propagating said bit in parallel with an analog sample as said analog sample propagates through said pipelined analog-to-digital converter; and
   a plurality of latch means coupled to corresponding ones of the shift register stages, respectively, each of said latch means being responsive to said single bit for latching said address bits from corresponding pipeline stages, respectively.

5. The high sampling rate, high resolution analog-to-digital converter system of claim 1 wherein said comparator means includes means for selectively updating said memory means at a periodic rate corresponding to the sampling rate of said low speed, high resolution analog-to-digital converter or at a different, controlled rate in response to a calibration signal.

6. The high sampling rate, high resolution analog-to-digital converter system of claim 5 wherein said different controlled rate of updating said memory means is a periodic.

7. The high sampling rate, high resolution analog-to-digital converter system of claim 5 wherein said different controlled rate of updating said memory means is a periodic rate different from said sampling rate of said low speed, high resolution analog-to-digital converter.

8. The high sampling rate, high resolution analog-to-digital converter system of claim 1 wherein said high speed, low resolution pipelined analog-to-digital converter comprises a plurality of pipeline stages, each of said pipeline stages comprising:
   a sample and hold circuit for sampling a pipeline stage analog input signal;
   a flash analog-to-digital converter coupled to said sample and hold circuit for converting a sampled pipeline stage analog input signal to a digital output signal;
   a digital-to-analog converter coupled to said flash analog-to-digital converter for receiving and converting to a pipeline stage analog output signal the digital output signal produced by said flash analog-to-digital converter; and a comparator coupled to the input of said flash analog-to-digital converter and to the output of said digital-to-analog converter for comparing said sampled pipeline stage analog input signal with said pipeline stage analog output signal and generating a difference signal, said difference signal being supplied as the pipeline stage analog input signal to the next successive pipeline stage of said high speed, low resolution pipelined analog-to-digital converter.

9. The high sampling rate, high resolution analog-to-digital converter system of claim 8 including shift register means having a plurality of shift register stages, each of said shift register stages being coupled, respectively, to the flash analog-to-digital converter of a corresponding one of the pipeline stages for accumulating said address bits and supplying said address bits to said comparator means to update said memory means.

10. The high sampling rate, high resolution analog-to-digital converter system of claim 9 wherein said shift register means comprises a multi-bit shift register in which each shift register stage can accumulate MN address bits, N being the number of bits resolution of the flash analog-to-digital converter of each pipeline stage and M being the relative position of said each shift register stage in said shift register means.

11. The high sampling rate, high resolution analog-to-digital converter system of claim 9 wherein said shift register means comprises:

a single bit shift register in which each shift register stage can accumulate a single bit, for propagating said bit in parallel with an analog sample as said analog sample propagates through said pipelined analog-to-digital converter; and a plurality of latch means coupled to corresponding ones of the shift register stage, respectively, each of said latch means being responsive to said single bit for latching said address bits from the flash analog-to-digital converter of corresponding pipeline stages, respectively.

12. A method for generating a high resolution digital conversion of an analog input signal at a high sampling rate, comprising the steps of:

generating at low speed, but with high resolution, a first digital output signal corresponding to said analog input signal;

generating with low resolution, but a high speed, a second digital output signal corresponding to said analog input signal;

addressing a memory with said second digital output signal to read out a third digital output signal;

comparing said first and third digital output signals to produce a fourth signal representative of the difference therebetween; and iteratively correcting said third digital output signal by employing said fourth signal to update said memory.

13. The method of generating a high resolution digital conversion of an analog input signal as recited in claim 12 further comprising selectively updating said memory at a periodic rate corresponding to the rate of generating said first digital output signal, in response to a calibration signal.

14. The method of generating a high resolution digital conversion of an analog input signal as recited in claim 12 further comprising selectively updating said memory at a controlled rate different from said periodic rate, in response to a calibration signal.

15. The method of generating a high resolution digital conversion of an analog input signal as recited in claim 14 wherein said controlled rate is an a periodic rate.

16. The method of generating a high resolution digital conversion of an analog input signal as recited in claim 14 wherein said controlled rate different from said periodic rate is itself periodic.

* * * * *